US006815243B2

(12) United States Patent
Lucak et al.

(10) Patent No.: US 6,815,243 B2
(45) Date of Patent: Nov. 9, 2004

(54) METHOD OF FABRICATING A MICROELECTROMECHANICAL SYSTEM (MEMS) DEVICE USING A PRE-PATTERNED SUBSTRATE

(75) Inventors: Mark A. Lucak, Hudson, OH (US); Richard D. Harris, Solon, OH (US); Michael J. Knieser, Richmond Heights, OH (US); Robert J. Kretschmann, Bay Village, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 161 days.

(21) Appl. No.: 09/843,563

(22) Filed: Apr. 26, 2001

(65) Prior Publication Data

US 2002/0158040 A1 Oct. 31, 2002

(51) Int. Cl.$^7$ .............................................. H01L 21/00
(52) U.S. Cl. ........................................ 438/52; 438/739
(58) Field of Search ........................ 438/52, 48; 216/2

(56) References Cited

U.S. PATENT DOCUMENTS

| | | | |
|---|---|---|---|
| 3,886,447 A | | 5/1975 | Tenaka |
| 4,560,953 A | | 12/1985 | Bozio |
| 5,012,207 A | | 4/1991 | Edwards |
| 5,025,346 A | | 6/1991 | Tang et al. |
| 5,194,819 A | | 3/1993 | Briefer |
| 5,243,861 A | | 9/1993 | Kloeck et al. |
| 5,343,157 A | | 8/1994 | Deschamps |
| 5,359,893 A | | 11/1994 | Dunn |
| 5,399,232 A | * | 3/1995 | Albrecht et al. ............... 216/2 |
| 5,413,668 A | | 5/1995 | Aslam et al. |
| 5,417,312 A | | 5/1995 | Tsuchitani et al. |
| 5,424,650 A | | 6/1995 | Frick |
| 5,491,604 A | | 2/1996 | Nguyen et al. |
| 5,536,988 A | | 7/1996 | Zhang et al. |

(List continued on next page.)

FOREIGN PATENT DOCUMENTS

| | | |
|---|---|---|
| EP | 0 665 590 A2 | 8/1995 |
| EP | 0 711 029 A2 | 5/1996 |
| EP | 0 763 844 A1 | 3/1997 |

OTHER PUBLICATIONS

Toumazou, C. et al., n–step Charge Injection Cancellation Scheme for Very Accurate Switched Current Circuits, Electronics Letters, V.30 (9) 680–681: 1994.

Emmerich, H., et al., A Novel Micromachined Magnetic–Field Sensor, MEMS 99 IEEE Conference, Jan. 17–21, 1999, IEEE Catalog No. 99ch36291c.

Madou, Marc, Fundamentals of Microfabrication, Chapters 2–4, CRC Press LLC, Boca Raton, FL: 1997.

Kovacs, Gregory T.A., Micromachined Transducers Sourcebook, Table of Contents, pp. 77–119 and Index, WCB McGraw–Hill, U.S.A.: 1998.

(List continued on next page.)

*Primary Examiner*—W. David Coleman
(74) *Attorney, Agent, or Firm*—Quarles & Brady LLP; R. Scott Speroff

(57) ABSTRACT

A method for fabricating MEMS structure includes etching a recess in an upper surface of a substrate that is bonded to a wafer that ultimately forms the MEMS structure. Accordingly, once the etching processes of the wafer are completed, the recess facilitates the release of an internal movable structure within the fabricated MEMS structure without the use of a separate sacrificial material.

49 Claims, 5 Drawing Sheets

U.S. PATENT DOCUMENTS

| | | |
|---|---|---|
| 5,563,343 A | 10/1996 | Shaw et al. |
| 5,572,057 A | 11/1996 | Yamamoto et al. |
| 5,578,528 A * | 11/1996 | Wuu et al. ............ 216/2 |
| 5,578,976 A | 11/1996 | Yao |
| 5,585,311 A | 12/1996 | Ko |
| 5,600,190 A | 2/1997 | Zettler |
| 5,646,432 A | 7/1997 | Iwaki et al. |
| 5,658,698 A | 8/1997 | Yagi et al. |
| 5,723,353 A | 3/1998 | Muenzel et al. |
| 5,761,350 A | 6/1998 | Koh |
| 5,783,340 A | 7/1998 | Farino et al. |
| 5,798,283 A | 8/1998 | Montague et al. |
| 5,804,314 A | 9/1998 | Field et al. |
| 5,815,051 A | 9/1998 | Hamasaki et al. |
| 5,834,864 A | 11/1998 | Hesterman et al. |
| 5,877,038 A | 3/1999 | Coldren et al. |
| 5,903,380 A | 5/1999 | Motamedi et al. |
| 5,920,978 A | 7/1999 | Koshikawa et al. |
| 5,943,155 A | 8/1999 | Goossen |
| 5,946,549 A | 8/1999 | Itoigawa et al. |
| 5,955,932 A | 9/1999 | Nguyen et al. |
| 5,959,516 A | 9/1999 | Chang et al. |
| 5,995,688 A | 11/1999 | Aksyuk et al. |
| 6,008,138 A | 12/1999 | Laermer et al. |
| 6,046,066 A | 4/2000 | Fang et al. |
| 6,060,336 A | 5/2000 | Wan |
| 6,071,426 A | 6/2000 | Lee et al. |
| 6,094,102 A | 7/2000 | Chang et al. |
| 6,100,477 A | 8/2000 | Randall et al. |
| 6,114,794 A | 9/2000 | Dhuler et al. |
| 6,116,756 A | 9/2000 | Peeters et al. |
| 6,127,767 A | 10/2000 | Lee et al. |
| 6,137,206 A | 10/2000 | Hill |
| 6,144,545 A | 11/2000 | Lee et al. |
| 6,149,190 A | 11/2000 | Galvin et al. |
| 6,159,385 A | 12/2000 | Yao et al. |
| 6,170,332 B1 | 1/2001 | MacDonald et al. |
| 6,188,322 B1 | 2/2001 | Yao et al. |
| 6,232,150 B1 | 5/2001 | Lin et al. |
| 6,232,841 B1 | 5/2001 | Bartlett et al. |
| 6,232,847 B1 | 5/2001 | Marcy, 5th et al. |
| 6,236,281 B1 | 5/2001 | Nguyen et al. |
| 6,257,705 B1 | 7/2001 | Silverbrook |
| 6,265,238 B1 | 7/2001 | Yaji et al. |
| 6,276,205 B1 | 8/2001 | McNie et al. |
| 6,307,169 B1 | 10/2001 | Sun et al. |
| 6,316,278 B1 | 11/2001 | Jacobsen et al. |
| 6,348,788 B1 | 2/2002 | Yao et al. |
| 6,356,378 B1 | 3/2002 | Huibers |
| 6,356,689 B1 | 3/2002 | Greywall |
| 6,369,931 B1 | 4/2002 | Funk et al. |
| 6,373,682 B1 | 4/2002 | Goodwin-Johansson |
| 6,384,353 B1 | 5/2002 | Huang et al. |
| 6,391,742 B2 | 5/2002 | Kawai |
| 6,400,009 B1 | 6/2002 | Bishop et al. |
| 6,411,214 B1 | 6/2002 | Yao et al. |
| 6,417,743 B1 | 7/2002 | Mihailovich et al. |
| 6,428,713 B1 | 8/2002 | Christenson et al. |
| 6,463,339 B1 | 10/2002 | Vasko |
| 6,465,929 B1 | 10/2002 | Levitan et al. |
| 6,466,005 B1 | 10/2002 | Yao et al. |
| 6,497,141 B1 | 12/2002 | Turner et al. |
| 6,504,356 B2 | 1/2003 | Yao et al. |
| 6,547,973 B2 | 4/2003 | Field |
| 2002/0017132 A1 | 2/2002 | McNie et al. |
| 2002/0021119 A1 | 2/2002 | Yao et al. |
| 2002/0158039 A1 * | 10/2002 | Harris et al. ............ 216/2 |

OTHER PUBLICATIONS

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

Miyajima, Hiroshi et al., High–Aspect–Ratio Photolithography for MEMS Applications, J. of Microelectomechanical Sys., V.4(4) 220–229, Dec. 1995.

Lu, Crist et al., A Monolithic Surface Micromachined Accelerometer with Digital Output, IEEE J. of Solid State Cirucits, V. 30 (12) 1367–1373, Dec. 1995.

Chen, Ming–Jer et al., Weak Inversion Charge Injection in Analog MOS Switches, IEEE J. of Solid–State Circuits, V. 30 (5) 604–606, May 1995.

Lemkin, Mark A. et al., A Fully Differential Lateral S? Accelerometer with Drift Cancellation Circuitry, Solid–State Sensor and Actuator Workshop, Hilton Head, South Carolina, Jun. 2–6, 1996, pp. 90–93.

Boser, Bernhard E. et al., Surface Micromachined Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5 (4) 283–297, Dec. 1996.

Noriega, Gerardo, Sigma–Delta A/D Converters–Audio and Medium Bandwidths, Technical Notes–DT3 from RMS Instrumentals website: www.rmsinst.com, 6 pages, Feb. 1996.

Internet page: Decimator Filter DLL, NeuroDimension Inc.: www.nd.com , May 31, 2001.

U.S. patent applcation No.: 09/406,654, filed on Sep. 27, 1999.

U.S. patent applcation No.: 09/400,125, filed on Sep. 21, 1999.

U.S. patent applcation No.: 09/406,509, filed on Sep. 28, 1999.

U.S. patent applcation No.: 09/955,493, filed on Sep. 18, 2001.

U.S. patent applcation No.: 09/955,494, filed on Sep. 18, 2001.

U.S. patent applcation No.: 09/675,861, filed on Sep. 29, 2000.

Storment, C.W., et al. "Flexible Dry–Released Process for Aluminum Electrostatic Actuators," Journal of Microelectricalmechanical Systems, 3(3), Sep. 1994, p 90–96.

* cited by examiner

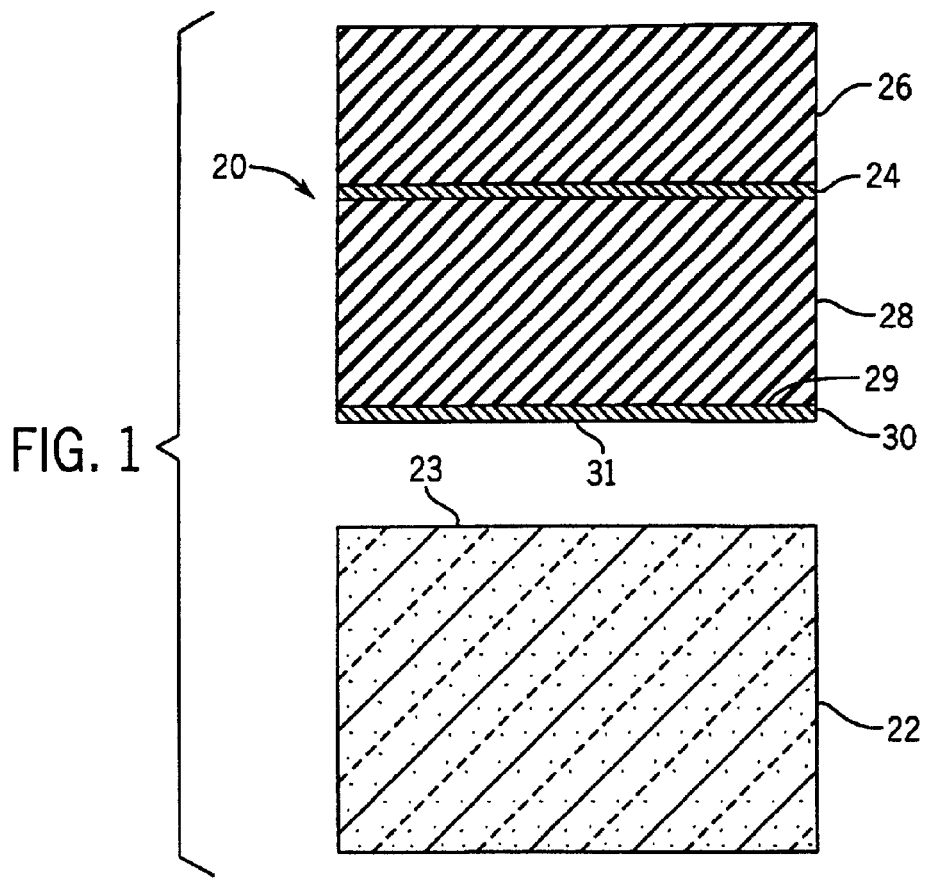
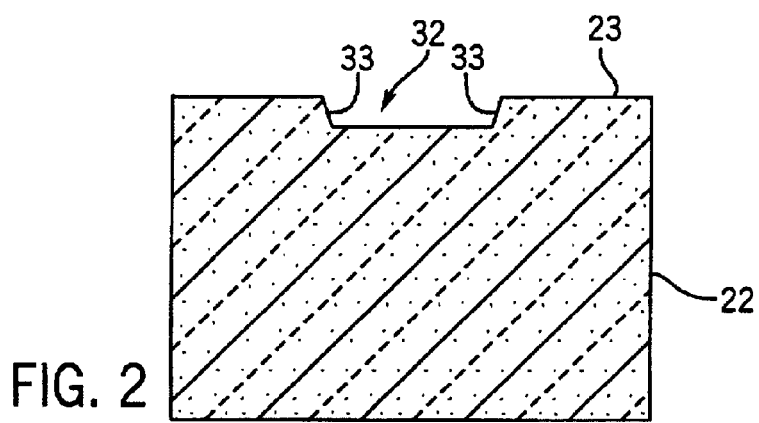

METHOD OF FABRICATING A MICROELECTROMECHANICAL SYSTEM (MEMS) DEVICE USING A PRE-PATTERNED SUBSTRATE

BACKGROUND OF THE INVENTION

1. Field of the Invention

The present invention relates to microelectromechanical systems (MEMS) and, in particular, relates to the fabrication of MEMS structures.

2. Discussion of the Related Art

Microelectromechanical Systems (MEMS) components are being progressively introduced into many electronic circuit applications and a variety of micro-sensor applications. Examples of MEMS components are electromechanical motors, radio frequency (RF) switches, high Q capacitors, pressure transducers and accelerometers. In one application, the MEMS structure is an accelerometer having a movable component that, in response to acceleration, is actuated so as to vary the size of a capacitive gap. Accordingly, the electrical output of the MEMS structure provides an indication of the strength of the external stimulus.

One method of fabricating such components, often referred to as surface micro-machining, uses a sacrificial layer, such as silicon dioxide, that is deposited and bonded onto a substrate, such as single crystal silicon which has been covered with a layer of silicon nitride. A MEMS component material, for example polycrystalline silicon, is then deposited on the sacrificial layer, followed by a suitable conductor, such as aluminum, to form an electrical contact with the ambient environment. The silicon layer is then patterned by standard photolithographic techniques and then etched by a suitable reactive ion etching plasma or by wet chemistry to define the MEMS structure and to expose the sacrificial silicon dioxide layer. The sacrificial layer is then etched to release the MEMS component.

Several disadvantages are associated with fabricating a MEMS structure using a sacrificial layer. First, it requires an etching process that selectively etches the sacrificial layer without reacting with the other materials that will ultimately form the MEMS structure. This limits the materials that may be used when fabricating the MEMS structure. Additionally, the use of a sacrificial layer increases the amount of materials needed to form the MEMS structure, thereby adding cost to the fabrication process. Furthermore, an additional etching step is needed to remove the sacrificial layer, thereby further reducing the efficiency of the fabrication process. In particular, because the structure forming the movable MEMS element is disposed above the sacrificial layer, a significant amount of time is needed to completely undercut the sacrificial layer.

What is therefore needed is an improved method for fabricating a MEMS structure that avoids the inefficiencies associated with the use of a sacrificial layer.

BRIEF SUMMARY OF THE INVENTION

The present inventors have recognized that a recess may be pre-etched in a substrate for a MEMS structure that facilitates release of the device.

In accordance with an aspect of the invention, a method of fabricating a MEMS structure includes attaching an etchable wafer to an upper surface of a substrate having a recess formed therein. The wafer includes a wafer portion from which a movable MEMS structure will be formed. The wafer is attached onto the substrate so that the wafer portion is positioned above the recess. Next, the wafer is etched downwards around the periphery of the movable structure to break through into the recess to release at least part of the movable structure from the substrate. This method therefore foregoes the need to perform substantial undercutting of a sacrificial layer.

The above aspects of the invention are not intended to define the scope of the invention for which purpose claims are provided. In the following description, reference is made to the accompanying drawings, which form a part hereof, and in which there is shown by way of illustration, and not limitation, a preferred embodiment of the invention. Such embodiment does not define the scope of the invention and reference must be made therefore to the claims for this purpose.

BRIEF DESCRIPTION OF THE DRAWINGS

Reference is hereby made to the following figures in which like reference numerals correspond to like elements throughout, and in which:

FIG. 1 is a schematic sectional side elevation view of an SOI wafer and a substrate that will form a composite structure in accordance with the preferred embodiment;

FIG. 2 is a sectional side elevation view of the substrate as illustrated in FIG. 1 after performing a standard photolithographic patterning process and an etching procedure;

DETAILED DESCRIPTION OF THE INVENTION

Figure 3:
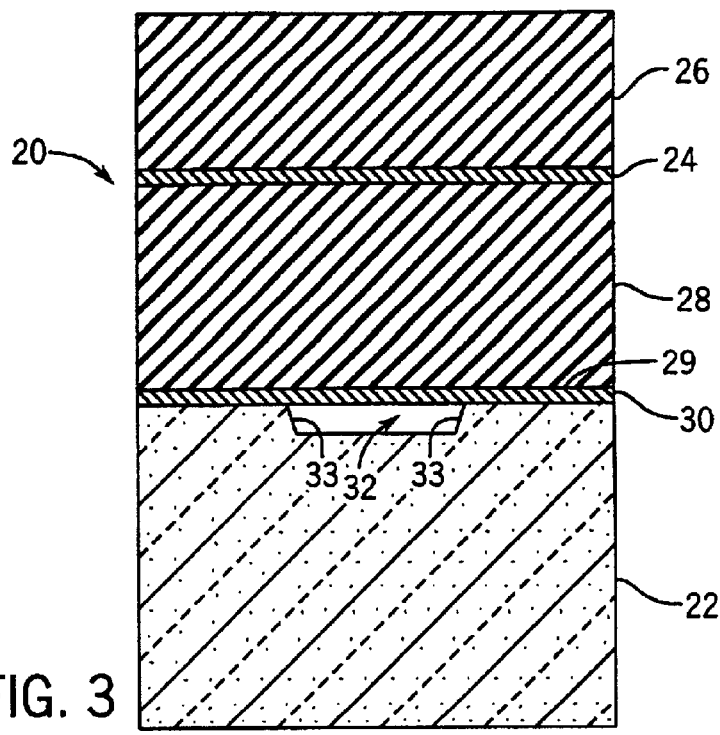
FIG. 3 is a sectional side elevation view of the wafer illustrated in FIG. 1 bonded to the substrate illustrated in FIG. 2 to form a composite structure.

Referring initially to FIG. 1, the components of a MEMS structure include a silicon-on-insulator (SOI) wafer 20 and a substrate 22 (which could be either nonconductive or conductive). The wafer 20 includes an upper and lower layer of silicon 26 and 28, respectively, that are separated by a first layer of nonconductive silicon dioxide 24. As will become more apparent from the description below, the thickness of layer 28 will ultimately define the thickness of the resulting MEMS structure. It should be appreciated that SOI wafers are commercially available having thicknesses for layer 28 of between 1 and 100 microns. The thickness of layer 26 may vary between, for example, 350 and 750 microns, and can depend on the diameter of the wafer. Such SOI wafers are commercially available, for example, from Shin-Etsu Handotai Co., Ltd., located in Japan.

A second layer of silicon dioxide 30 is grown or deposited on the lower surface 29 of the silicon layer 28, for example by using a plasma enhanced chemical vapor deposition process (PECVD) as is understood by those having ordinary skill in the art. Alternatively, layer 30 could comprise silicon nitride. The silicon dioxide layer is added in accordance with the preferred embodiment to facilitate a mechanical connection, that is electrically isolating, between different portions of the MEMS structure. It should be appreciated, however, that the substrate 22 may be either conducting or nonconducting, and may therefore alternatively comprise high resistivity silicon, crystalline sapphire, crystalline silicon, or poly-crystalline silicon, silicon carbide, or a ceramic such as alumina, aluminum nitrite, and the like, or gallium arsenide. Accordingly, the substrate may be conducting or nonconducting, depending on the fabricated MEMS structure and its application. It may be desirable to employ a silicon substrate when producing a silicon MEMS structure to ensure that the thermal and mechanical properties of the substrate and MEMS structure match to make processing easier and to eliminate the possibility of undesirable thermally induced stresses. On the other hand, it may be desirable to employ non-conducting substrates when very high electrical isolation is necessary.

Referring now to FIG. 2, a recess 32 is formed in the upper surface 23 of the substrate 22 by placing photoresist on the substrate and patterning it with standard photolithographic techniques such that, when etched, the portion of the substrate having the photoresist remaining thereon will remain intact, while the exposed material will be removed. Accordingly, to form the recess 32 in the middle portion of the upper surface 23 of the substrate 22, the photoresist is patterned to remain on the outer portions of the upper surface, and the substrate 22 is etched using a plasma etch or wet chemistry etch suitable for the material composition of the substrate, as is understood by those having ordinary skill in the art. It should be appreciated that several MEMS structures may be fabricated from a single wafer, and that photoresist in such embodiments is patterned in accordance with the present invention by providing gaps therebetween, wherein the gaps will ultimately define the recesses 32 in the wafer.

The photoresist is removed to reveal the recess 32 having beveled side walls 33. While the recess 32 is shown as being isotropically etched in the figures, thereby producing the beveled walls 33, it should be appreciated that an anisotropic etching process (for example, using an anisotropic etching plasma) could alternatively be used, which would produce side walls that are substantially perpendicular to the upper surface of the substrate 22. The recess 32 is chosen to be sufficiently deep so as to enable the MEMS structure to release from the substrate 22 after fabrication, as will be described in more detail below.

While the recess 32 has been described in accordance with the preferred embodiment, other methods of releasing the substrate could be implemented as described in patent application entitled "Method for Fabricating an Isolated Micro-Electromechanical System Device Using an Internal Void" filed on even date herewith, the disclosure of which is hereby incorporated by reference as if set forth in its entirety herein.

Referring now to FIG. 3, the bottom surface 31 of the silicon dioxide layer 30 is bonded to the upper surface 23 of the substrate 22. In particular, the wafer 20 is positioned above the insulating substrate 22, and is bonded thereto via, for example, high temperature fusion bonding or any other suitable process as understood by those having ordinary skill in the art. Because the wafer 20 does not need to be bonded to the substrate 22 using a layer that will need to be undercut in a subsequent procedure, as in prior art fabrication methods, the bond will not be sensitive to temperature elevations that may occur at later stages of the fabrication process. It should be appreciated that, depending on the material chosen for the substrate 22, it may be desirable to grow or deposit an oxide layer onto the upper surface 23 thereof prior to the bonding step in order to provide a suitable layer to bond with the lower surface 31 of the silicon dioxide layer 30.

Figure 4:
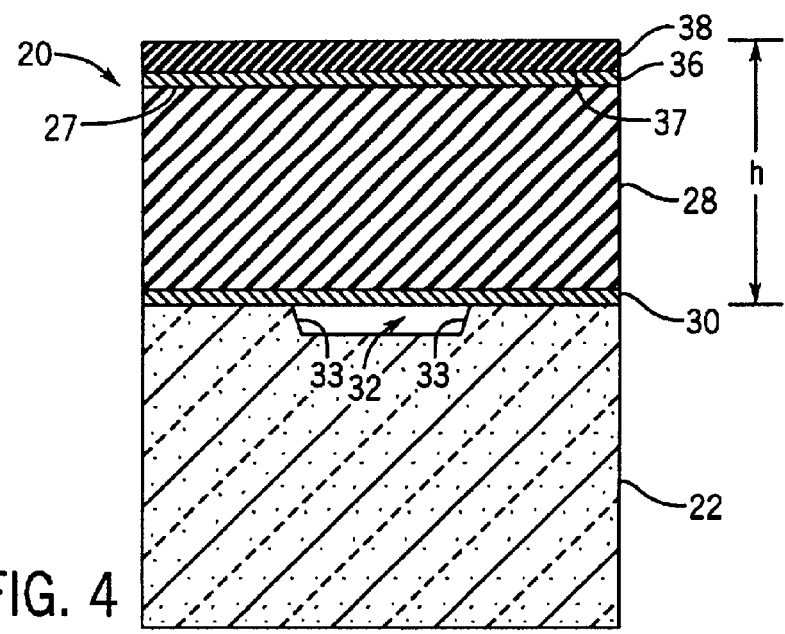
FIG. 4 is a sectional side elevation view of the composite structure illustrated in FIG. 3 having a portion of the SOI wafer removed and additional layers deposited in accordance with the preferred embodiment.

Referring also now to FIG. 4, the relatively thick silicon base layer 26 is mostly removed by a grinding and polishing process, and is finished by subsequently etching in tetramethylammonium hydroxide (TMAH) to expose silicon dioxide layer 24. In this regard, layer 24 provides an easily controlled etch stop when removing layer 26 as it is not etched by TMAH. The oxide layer 24 is then removed by etching with hydrofluoric acid to reveal an upper surface 27 of the silicon layer 28. The layer 28 remains having the desired uniform thickness, it being appreciated that the final height h of the wafer 20 will correspond generally to the desired height of the resulting fabricated MEMS structure, as will become more apparent from the description below.

The same desired structure can also be obtained without the use of an SOI wafer, but with a simple silicon wafer instead. Accordingly, the wafer 20 could comprise silicon, silicon carbide, or gallium arsenide. If the wafer 20 is not an SOI wafer, it would be ground and polished to the desired thickness after bonding. The use of commercially available SOI wafers facilitates the attainment of the desired silicon thickness. Also, additional silicon from layer 28 may be removed from the SOI wafer 20, if so desired, by grinding and polishing.

Next, a conductive layer 36, such as aluminum, is deposited onto the upper surface 27 either by evaporation or sputtering, or any suitable alternative process, as is well known in the art. The conductive aluminum layer 36 will eventually form the electrical contact for the MEMS structure after the fabrication process has been completed, as will become more apparent from the description below. Alternative suitable conductors may be deposited besides aluminum, such as copper, silver, gold or nickel, or a highly doped semiconductor material such as silicon, silicon carbide, and gallium arsenide, or any other suitable conductive metal that is compatible with the fabrication processes of the present invention. Next, a silicon dioxide layer 38 is deposited onto the upper surface 37 of the aluminum layer 36 to provide protection for the aluminum layer 36 and to provide a mask for future etching of the aluminum and silicon. Alternatively, the layer 38 could comprise silicon nitride. Specifically, the layer 38 may be deposited using the aforementioned PECVD process, or other well known methods. Alternatively, photoresist could be used instead of layer 38 to provide a pattern for etching through both the aluminum and silicon layers 36 and 28. Because layer 38 is subsequently removed regardless during a subsequent fabrication process, as will be described in more detail below, the resulting MEMS structure 58 has the composition whether or not layer 38 is used as a protective layer.

Figure 5:
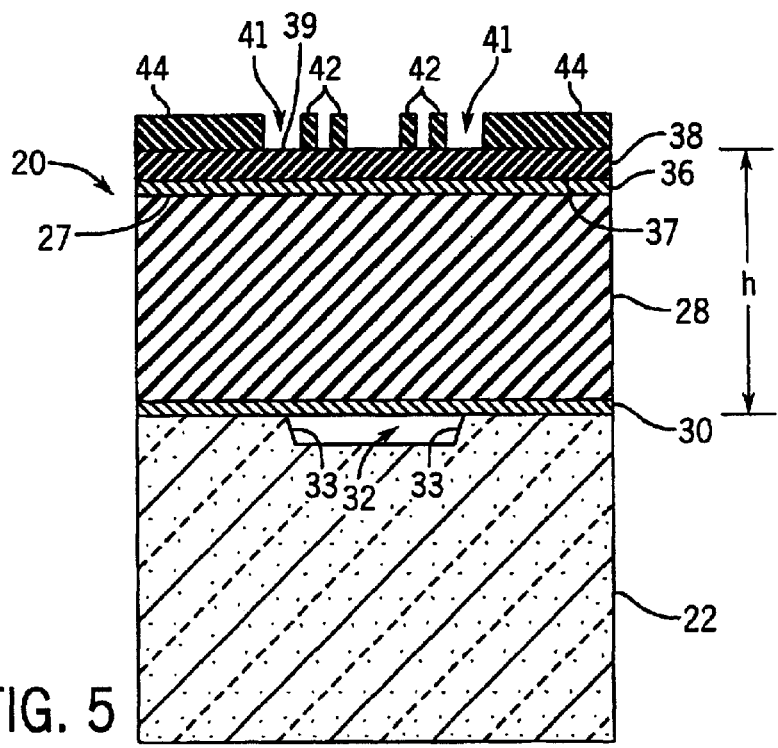
FIG. 5 is a sectional side elevation view of the composite structure illustrated in FIG. 4 having photoresist applied to the upper surface thereof.

Once the desired layers are in place, they are etched so as to form the MEMS structure in accordance with the preferred embodiment. Referring in particular to FIG. 5, the etching process of the wafer 20 begins by depositing a photoresist layer and patterning by standard photolithographic techniques to leave inner and outer members 42 and 44, respectively, having a gap 41 disposed therebetween that is at least partially aligned with recess 32. As will become more apparent from the description below, gap 41 will become a variable size gap separating a movable MEMS element 52 from a stationary MEMS element 50 (shown in FIG. 9) once the wafer 20 has been completely etched. The recess 32 is disposed in the substrate 22 so as to allow the fabricated movable MEMS element to be released from the substrate upon etching. Accordingly, the wafer 20 is etched into the recess 32, thereby releasing the movable MEMS element, as will be described in more detail below. Advantageously, the movable MEMS element will accordingly be released without the need to undercut a sacrificial layer. It should be appreciated that FIG. 5 is a schematic illustration whose purpose is to illustrate the conceptual placement of the photoresist in relation to the recess 32, and could assume any configuration whatsoever that would produce a suitable MEMS structure and facilitate the release of the movable MEMS element.

Figure 6:
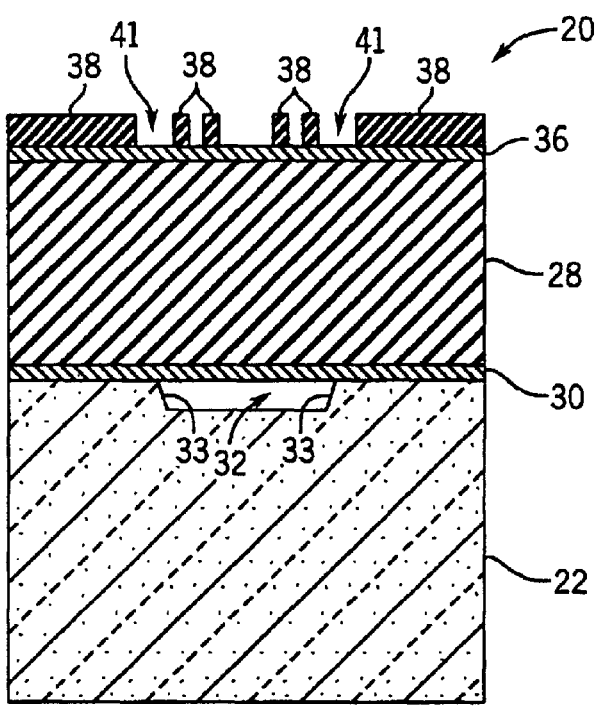
FIG. 6 is a sectional side elevation view of the composite structure illustrated in FIG. 5 following photolithographic patterning and etching of the topmost layer and photoresist removal.

Referring now also to FIG. 6, the upper surface 39 of the silicon dioxide layer 38 is patterned by standard photolithography techniques to produce a structure which will define the stationary and movable MEMS elements 52 and 50 (shown in FIG. 9), respectively. In accordance with the preferred embodiment, the silicon dioxide layer 38 is etched, for example, by using a dry anisotropic etching plasma, such as trifluoro-methane ($CHF_3$), commercially known as fluoroform. The etching continues until all silicon dioxide disposed between photoresist members 42 and 44 has been etched, thereby exposing the conductive aluminum layer 36. The photoresist is removed using the appropriate solvent for the photoresist material used. Because the etched silicon dioxide layer 38 is selectively etchable from the remaining materials that comprise wafer 20, layer 38 will therefore provide the structure necessary to define the etching pattern for subsequent etching processes, as will now be described. As described above, if layer 38 is not present, the photoresist will provide the structure necessary to define the subsequent etching processes.

Figure 7:
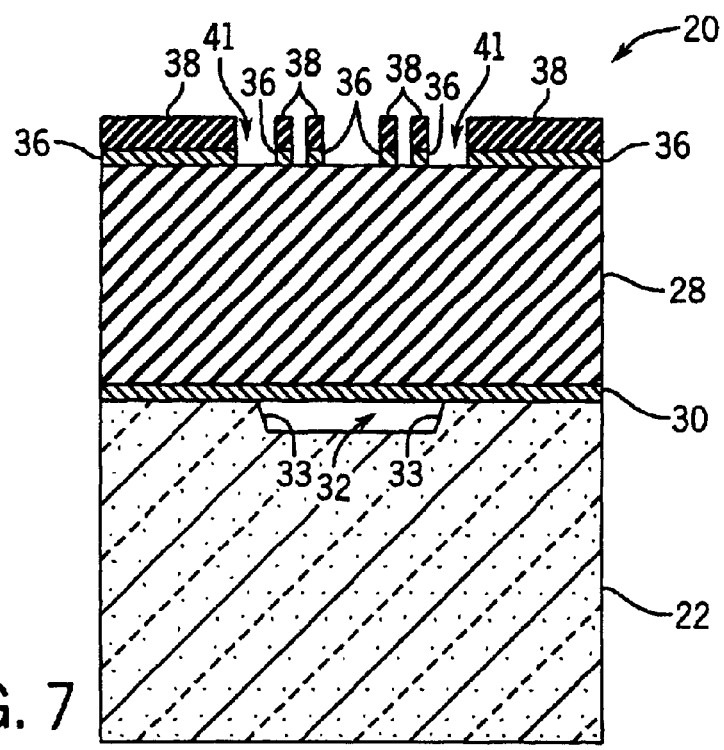
FIG. 7 is a sectional side elevation view of the structure illustrated in FIG. 6 after etching a conductive layer of the wafer.
Figure 8:
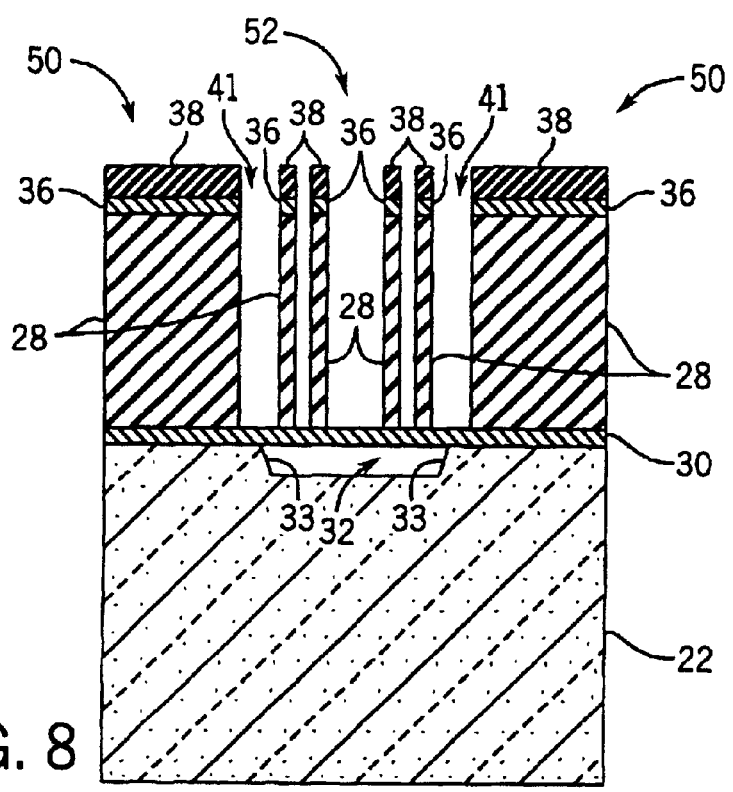
FIG. 8 is sectional side elevation view of the structure illustrated in FIG. 7 after further etching the wafer.

Referring to FIG. 7, the aluminum layer 36 is etched, for example, by using an anisotropic etching plasma that selectively etches aluminum, and that does not react to either silicon dioxide or silicon. A chlorine plasma has been found to be suitable for anisotropically dry etching the aluminum layer 36 in accordance with the preferred embodiment. Because the plasma does not react with silicon dioxide or silicon, the resulting etched aluminum structures 36 are vertically aligned with the previously etched silicon dioxide layer 38. Once the aluminum has been etched, the silicon layer 28 is exposed and ready to be etched as will now be described with reference to FIG. 8.

Specifically, the silicon layer 28 is anisotropically dry etched by a process commonly referred to as Deep Reactive Ion Etching (DRIE), which involves setting up a reactive etching environment in a suitably chosen gas by exciting with an inductively coupled plasma (ICP), as is understood by those having ordinary skill in the art. Because silicon dioxide is not etched under the same conditions as silicon, the silicon layer 28 is etched until the silicon dioxide etch stop layer 30 is revealed to produce a pair of stationary outer structures 50 and an inner set of structures 52 that will ultimately define a stationary conductive MEMS element and a movable MEMS element, respectively, as will be described in more detail below.

Figure 9:
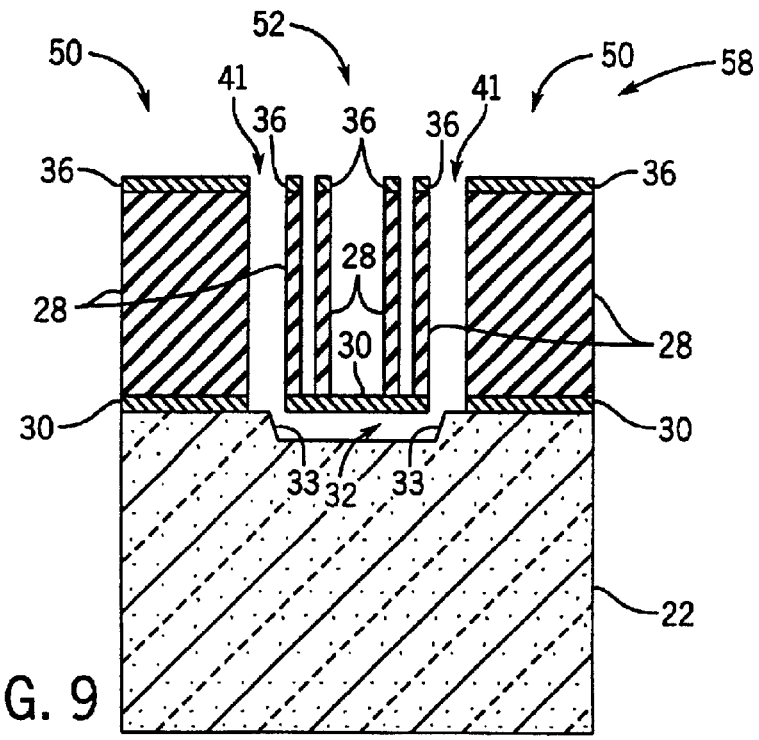
FIG. 9 is a schematic sectional side elevation view of the fabricated structure illustrated in FIG. 8 after further photolithographic patterning and etching of the wafer.

Next, referring to FIG. 9, the silicon dioxide layers 30 and 38 are photolithographically patterned and anisotropically etched, for example, in fluoroform, in accordance with the preferred embodiment, though it should be easily appreciated that any suitable etchant may be used. Layers 36 and 28 as well as patterned photoresist aligned with the inner MEMS element 52 (not shown), provide the structure necessary to define the etching pattern for the etching of layer 30, such that only that silicon dioxide in layer 30 that is aligned with gap 41 is removed. It should be appreciated that the silicon dioxide in layer 30 that is aligned with the gap connects the inner structure 52 to the outer structures 50. Accordingly, etching this silicon dioxide creates stationary outer MEMS elements 50 and additionally releases the movable MEMS element 52 from the substrate 22 without the need to deposit and subsequently undercut a sacrificial layer, as in prior art fabrication techniques. As a result, only those materials that ultimately form the fabricated MEMS structure 58 are used in the fabrication process. The release of the movable MEMS element 52 additionally transforms gap 41 into a variable size gap 41, whose size may be used to define the capacitance of the MEMS structure, as will be described in more detail below.

While layer 38 is removed in accordance with the preferred embodiment, layer 38 could remain as part of the fabricated MEMS structure 58 to provide a protective layer for the aluminum layer 36.

The final MEMS structure 58 therefore includes stationary outer MEMS elements 50, and an inner movable MEMS element 52. It should be appreciated, however, that wafer 20 could alternatively be etched in accordance with the present invention to produce any MEMS structure having a suitable configuration that facilitates the release of a movable MEMS element. The outer and inner MEMS elements 50 and 52 include a silicon layer 28 separated from the substrate 22 by a non-conductive layer of silicon dioxide 30, thereby providing electrical isolation on the order of 2000 volts. A conductive layer of aluminum 36 is disposed above the silicon layer. In accordance with the preferred embodiment, a wire may be connected to the aluminum layers 36 of the stationary MEMS elements 53 to place the stationary elements in electrical communication with the ambient environment and render the device 58 operable.

The preferred embodiment of the invention could thus be implemented to form a MEMS structure incorporating a wafer level cap, having electrical leads extending from the base of conductive elements 50 to the ambient environment outside the cap, as described in a patent application entitled "Method for Fabricating an Isolated Microelectromechanical System (MEMS) Device Incorporating a Wafer Level Cap" filed on even date herewith, the disclosure of which is hereby incorporated by reference as if set forth in its entirety herein.

Figure 10:
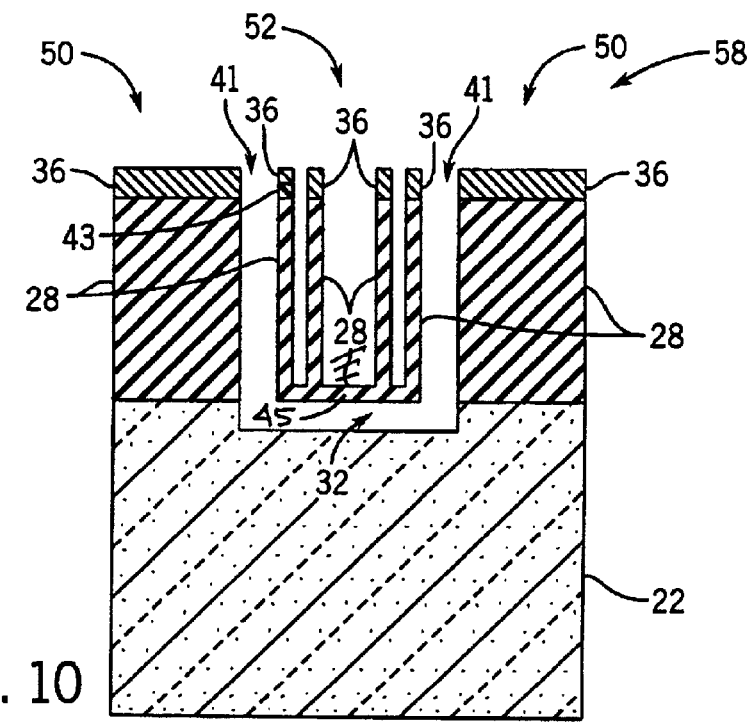
FIG. 10 is a schematic sectional side elevation view of a fabricated MEMS structure constructed in accordance with an alternate embodiment of the invention.

Referring now to FIG. 10, the MEMS structure 58 is illustrated in accordance with an alternate embodiment of the invention, wherein the $SiO_2$ layer 30 has been replaced with a silicon base 45. In order to provide electrical isolation between the inner MEMS structure 52 and outer conductive elements 50, a layer of silicon dioxide 43 is disposed between the silicon 28 and aluminum 36 on the outermost inner MEMS finger disposed proximal the interface between field and control sides of the integrated circuit, as an example. Layer 43 is sufficient to provide low level electrical isolation on the order of 50 volts, suitable for typical integrated circuits. Accordingly, this embodiment is desirable when the fabricated MEMS structure 58 does not require the 2000 volt isolation achieved by oxide layer 30.

Furthermore, this embodiment is easier to fabricate and is stronger due to the uniformity of materials used to fabricate inner element 52.

The MEMS structure 58 could therefore perform any function suitable for a MEMS application. For example, the device 58 could comprise an accelerometer whose movable MEMS element 52 is a cantilever beam that deflects in response to an external stimulus, such as an acceleration or vibration of the device 58. Accordingly, as the size of the gap between the stationary conductive elements 50 and the movable MEMS element 52 varies, so will the output capacitance, thereby providing a measurement of the amount of deflection of the movable MEMS element 52. A measurement of the strength of an external stimulus may thereby be obtained.

It should be appreciated by one having ordinary skill in the art that a portion of a MEMS structure 58 has been illustrated, it being appreciated that inner MEMS element 52 is connected to substrate 22 at its two distal ends, as described in patent application filed on Mar. 13, 2001 and entitled "Microelectricalmechanical System (MEMS) Electrical Isolator with Reduced Sensitivity to Internal Noise" the disclosure of which is hereby incorporated by reference. For example, the void 32 that is disposed in substrate 22 may terminate, thereby connecting element 52 to the substrate. In accordance with the preferred embodiment, an elongated section of element 52 is suspended and free from the substrate, thereby permitting deflection of the free portion of the movable MEMS element with respect to the substrate 22. An electrical trace may be connected to the movable element 52 at these connection locations.

The above has been described as a preferred embodiment of the present invention. It will occur to those that practice the art that many modifications may be made without departing from the spirit and scope of the invention. For example, while the various layers are described as being made of silicon, silicon dioxide, and aluminum, any other suitable compositions could be used that have the desired conductive or insulating properties. In order to apprise the public of the various embodiments that may fall within the scope of the invention, the following claims are made.

We claim:

1. A method of fabricating a MEMS structure, comprising the steps of:
   (a) forming a recess in an upper surface at a substrate;
   (b) attaching an etchable wafer to the upper surface of the substrate, including a wafer portion from which a movable structure will be formed, the wafer portion being positioned over the recess; and
   (c) etching downward in the wafer at a periphery of the wafer portion to break through in to the recess, thereby releasing at least part of the movable structure from the substrate without the need for substantial undercutting wherein step (c) creates a first stationary conductive element and a variable size gap between the movable structure and the stationary conductive element.

2. The method us recited in claim 1, further comprising depositing a conductive layer onto the wafer.

3. The method as recited in claim 2, further comprising depositing a protective layer onto an upper surface of the conductive layer.

4. The method as recited in claim 2, wherein the conductive layer is selected from the group consisting of aluminum, copper, silver, gold and nickel.

5. The method as recited in claim 3, wherein the protective layer is selected from the group consisting of silicon dioxide and silicon nitride.

6. The method as recited in claim 1, wherein the wafer is selected from the group consisting of silicon, silicon carbide and gallium arsenide.

7. The method as recited in claim 1, wherein the substrate is a non-conductive substrate selected from the group consisting of glass, high resistivity silicon, crystalline sapphire, and ceramic.

8. The method as recited in claim 1, wherein the substrate is a conductive substrate selected from the group consisting of silicon, silicon carbide, and gallium arsenide.

9. The method as recited in claim 1, wherein the recess has beveled edges.

10. The method as recited in claim 1, further comprising the step of forming an intermediate layer between the stationary conductive element and the substrate, wherein the intermediate layer is selected from the group consisting of silicon, poly-crystalline silicon, amorphous silicon, silicon carbide and gallium arsenide.

11. The method as recited in claim 1, further comprising the step of forming a base layer that forms a lower surface of the movable structure.

12. The method as recited in claim 11, wherein the base layer is selected from the group consisting of silicon dioxide and silicon nitride.

13. The method as recited in claim 1, wherein the recess has beveled outer edges.

14. The method as recited in claim 1, wherein step (c) further comprises forming a second stationary conductive element extending outwardly from the substrate, wherein the movable structure is disposed between the first and second stationary conductive elements.

15. The method as recited in claim 14, wherein the first and second stationary conductive elements are electrically isolated from each other.

16. The method as recited in claim 11, wherein the base layer is insulating.

17. A method of fabricating a MEMS structure, comprising the steps of:
   (a) forming a recess in an upper surface of a substrate;
   (b) attaching an etchable wafer to the upper surface of the substrate, including a wafer portion from which a movable structure will be formed, the wafer portion being positioned over the recess; and
   (c) etching downward in the wafer at a periphery of the wafer portion to break through in to the recess, thereby releasing at least part of the movable structure from the substrate and forming a base layer that forms a lower surface of the movable structure without the need fur substantial undercutting.

18. The method as recited in claim 17, further comprising depositing a conductive layer onto the wafer.

19. The method as recited in claim 18, further comprising depositing a protective layer onto an upper surface of the conductive layer.

20. The method as recited in claim 18, wherein the conductive layer is selected from the group consisting aluminum, copper, silver, gold and nickel.

21. The method as recited in claim 19, wherein the protective layer is selected from the group consisting of silicon dioxide and silicon nitride.

22. The method as recited in claim 17, wherein the wafer is selected from the group consisting of silicon, silicon carbide and gallium arsenide.

23. The method as recited in claim 17, wherein the substrate is a non-conductive substrate selected from the group consisting of glass, high resistivity silicon, crystalline sapphire, and ceramic.

24. The method as recited in claim 17, wherein the substrate is a conductive substrate selected from the group consisting of silicon, silicon carbide, and gallium arsenide.

25. The method as recited in claim 17, wherein the recess has beveled edges.

26. The method as recited in claim 17, wherein step (c) further comprises forming a first stationary conductive element extending outwardly from the substrate.

27. The method as recited in claim 26, wherein step (c) further comprises forming a variable size gap between the movable structure and the stationary conductive element.

28. The method as recited in claim 26, further comprising the step of forming an intermediate layer between the stationary conductive element and the substrate, wherein the intermediate layer is selected from the group consisting of silicon, poly-crystalline silicon, amorphous silicon, silicon carbide and gallium arsenide.

29. The method as recited in claim 17, wherein the base layer is selected from the group consisting of silicon dioxide and silicon nitride.

30. The method as recited in claim 17, wherein the recess has beveled outer edges.

31. The method as recited in claim 26, wherein step (c) further comprises forming a second stationary conductive element extending outwardly from the substrate, wherein the movable structure is disposed between the first and second stationary conductive elements.

32. The method as recited in claim 31, wherein the first and second stationary conductive elements are electrically isolated from each other.

33. The method as recited in claim 17, wherein the base layer is insulating.

34. A method of fabricating a MEMS structure, comprising the steps of:
(a) forming a recess in an upper surface of a substrate;
(b) attaching an etchable wafer to the upper surface of the substrate, including a wafer portion from which a movable structure will be formed, the wafer portion being positioned over the recess; and
(c) etching downward in the wafer at a periphery of the wafer portion to break through in to the recess, thereby releasing at least part of the movable structure from the substrate, and forming first and second stationary conductive elements extending outwardly from the substrate, wherein the movable structure is disposed between the first and second stationary conductive elements, without the need for substantial undercutting.

35. The method as recited in claim 34, further comprising depositing a conductive layer onto the wafer.

36. The method as recited in claim 35, further comprising depositing a protective layer onto an upper surface of the conductive layer.

37. The method as recited in claim 35, wherein the conductive layer is selected from the group consisting of aluminum, copper, silver, gold and nickel.

38. The method as recited in claim 36, wherein the protective layer is selected from the group consisting of silicon dioxide and silicon nitride.

39. The method as recited in claim 34, wherein the wafer is selected from the group consisting of silicon, silicon carbide and gallium arsenide.

40. The method as recited in claim 34, wherein the substrate is a non-conductive substrate selected from the group consisting of glass, high resistivity silicon, crystalline sapphire, and ceramic.

41. The method as recited in claim 34, wherein the substrate is a conductive substrate selected from the group consisting of silicon, silicon carbide, and gallium arsenide.

42. The method as recited in claim 34, wherein the recess has beveled edges.

43. The method as recited in claim 34, wherein step (C) further comprises forming a variable size gap between the movable structure and the stationary conductive element.

44. The method as recited in claim 35, further comprising the step of forming an intermediate layer between the stationary conductive element and the substrate, wherein the intermediate layer is selected from the group consisting of silicon, poly-crystalline silicon, amorphous silicon, silicon carbide and gallium arsenide.

45. The method as recited in claim 34, further comprising the step of forming a base layer that forms a lower surface of the movable structure.

46. The method as recited in claim 45, wherein the base layer is selected from the group consisting of silicon dioxide and silicon nitride.

47. The method as recited in claim 34, wherein the recess has beveled outer edges.

48. The method as recited in claim 34, wherein the first and second stationary conductive elements are electrically isolated from each other.

49. The method as recited in claim 46, wherein the base layer is insulating.

* * * * *